(12) United States Patent
Crawford

(10) Patent No.: US 6,496,549 B1
(45) Date of Patent: Dec. 17, 2002

(54) METHOD AND APPARATUS FOR DEMODULATING AMPLITUDE-SHIFT KEYED DATA SIGNALS

(75) Inventor: Richard D. Crawford, Los Altos, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/352,428

(22) Filed: Jul. 13, 1999

(51) Int. Cl.[7] .................................................. H03D 1/24
(52) U.S. Cl. ......................... 375/320; 327/18; 329/347
(58) Field of Search ................................. 375/316, 320, 375/342, 353, 268, 322; 327/18, 24, 26, 37, 174; 359/124, 189, 325; 329/304, 347

(56) References Cited

U.S. PATENT DOCUMENTS

| | | | |
|---|---|---|---|
| 4,748,686 A | * 5/1988 | Glomb | |
| 4,751,745 A | * 6/1988 | Price | |
| 5,319,191 A | * 6/1994 | Crimmins | |
| 5,537,634 A | * 7/1996 | Fye | 359/124 |
| 5,627,668 A | * 5/1997 | Fye | 359/124 |
| 5,684,830 A | * 11/1997 | Ichikawa et al. | 375/254 |
| 5,936,462 A | * 8/1999 | Muraishi | 329/311 |
| 6,205,102 B1 | * 3/2001 | Spruit | 369/59 |

* cited by examiner

Primary Examiner—Jean Corrielus

(57) ABSTRACT

An approved demodulator is disclosed for demodulating optical ASK data signals whose data bits are each characterized by either an absence of pulses or a burst of pulses at a predetermined frequency. The demodulator includes an amplifier tuned to this predetermined frequency, and it further includes an edge detector that produces an envelope of the amplified signal. A comparator then compares the envelope signal with a prescribed threshold, to produce a pulse signal for each received burst of pulses. The duration of this pulse signal is then stretched so as to correspond to the pulse burst's expected nominal duration. The demodulator is specially configured such that it can properly demodulate ASK data signals having power levels that vary over a range of several orders of magnitude.

11 Claims, 4 Drawing Sheets

METHOD AND APPARATUS FOR DEMODULATING AMPLITUDE-SHIFT KEYED DATA SIGNALS

BACKGROUND OF THE INVENTION

This invention relates generally to demodulators for amplitude-shift keyed (ASK) signals and, more particularly, to demodulators that demodulate digital ASK data signals whose data bits are each characterized by either an absence of pulses or a burst of pulses at a predetermined frequency.

Demodulators of this particular kind are commonly used in optical communication systems, as part of a receiver that receives optical signals modulated according to ASK data signals. The data signals carry digital data in the form either of an absence of light pulses or a burst of light pulses, occurring at a predetermined frequency. In one common system, the data rate is 75 kilobits per second, and the light pulse bursts each have a duration of 6.67 microseconds, at a frequency of 1.5 MHz. Each burst thus incorporates ten light pulses.

One characteristic of optical communication systems of this kind is that the signal strength of the ASK data signals being received can vary over a range as high as 5000 to 1. This can pose a significant design problem when a signal of relatively high strength is followed immediately by a signal of relatively low strength. The receiver's latency period is a measure of how quickly it can recover from the receipt of a signal of relatively high strength so as to properly receive a signal of relatively low strength. Latency periods of less than 100 microseconds are desired.

In the past, some demodulators of this kind have achieved low latency periods by feeding back a signal to the receiver from a downstream processor, indicating that a data frame has concluded and that the receiver should reset itself to await the receipt of a new data signal. Such demodulators are generally effective in providing the desired low latency periods; however, there is a need for an ASK demodulator that can provide a similar low latency period without the need to feed back a reset signal from a downstream processor. The present invention fulfills this need and provides further related advantages.

SUMMARY OF THE INVENTION

The present invention is embodied in an improved demodulator, and related method, for demodulating amplitude-shift keyed (ASK) data signals, in which data bits are each characterized by either an absence of pulses or a burst of pulses at a predetermined frequency, wherein the signal strength of the data signal can vary by several orders of magnitude. The demodulator includes a bandpass amplifier that receives and amplifies the ASK data signal, the amplifier being tuned to the predetermined frequency of the bursts of pulses, and it further includes an edge detector that detects the envelope of the amplified signal, to produce an envelope signal. A comparator compares the envelope signal with a prescribed threshold, to produce a pulse signal indicative of the presence of a burst of pulses in the ASK data signal. Finally, a pulse stretcher increases the length of each pulse in the pulse signal to a length substantially the same as the expected length of the corresponding burst of pulses in the ASK data signal.

In other, more detailed features of the invention, the ASK data signal is an optical signal, and the apparatus further incorporates a device, e.g., a photodiode, for converting that optical signal to a corresponding electrical signal. In addition, the bandpass amplifier has a substantially constant gain, which leads to the envelope signal having a duration that varies according to the strength of the original ASK data signal. The pulse stretcher can take the form of a monostable multivibrator, for causing the successive pulses in the pulse signal to have durations substantially the same as the expected nominal durations of the pulse bursts in the original ASK data signal.

Other features and advantages of the present invention should be apparent from the following description of the preferred embodiment, taken in conjunction with the accompanying drawings, which illustrate, by way of example, the principles of the invention.

DESCRIPTION OF THE PREFERRED EMBODIMENT

Figure 1:
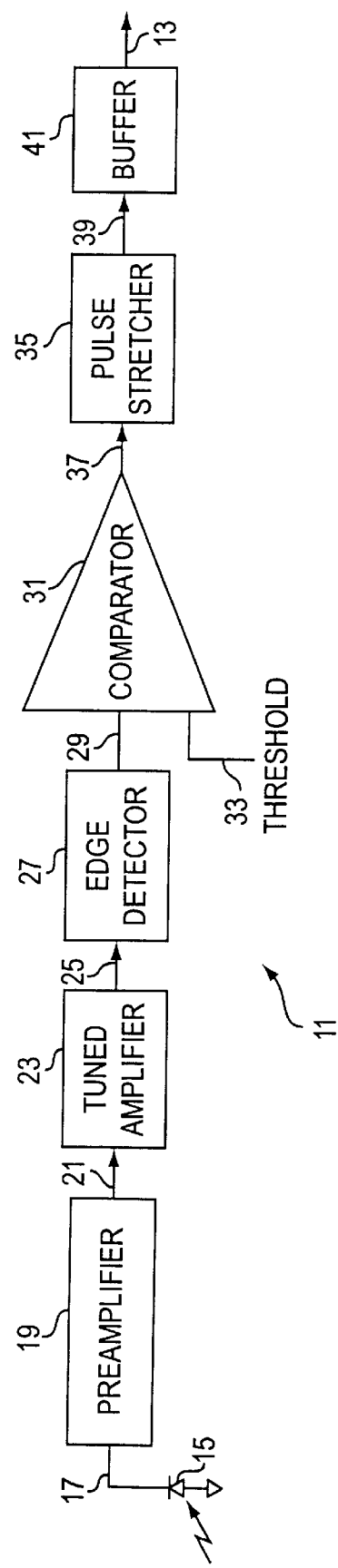
FIG. 1 is a simplified block diagram of an amplitude-shift keyed demodulator in accordance with a preferred embodiment of the invention.

With reference now to the drawings, and particularly to FIG. 1, there is shown a digital amplitude-shift keyed (ASK) demodulator 11 for receiving and demodulating an ASK optical signal received from a remote source (not shown). The ASK optical signal carries digital data in the form either of an absence of light pulses or a burst of light pulses, occurring at a predetermined frequency, e.g., 1.5 MHz. In one common system, the data rate is 75 kilobits per second, and the light pulse bursts each have a duration of 6.67 microseconds. Each burst thus incorporates ten light pulses. The demodulator produces a digital output signal on line 13, whose state varies according to the presence or absence of a received burst of light pulses.

The ASK demodulator 11 is configured such that it can properly receive and demodulate ASK optical signals having intensities as low as 250 nanowatts/cm$^2$ and as high as 1.25 milliwatts/cm$^2$. This represents a range of 5000 to 1, or 74 db. The demodulator also is configured to have a latency period of less than 100 microseconds, such that it can properly demodulate a signal of relatively low strength immediately following a signal of relatively high strength.

As shown in FIG. 1, the ASK demodulator 11 includes a photodiode 15 for receiving ASK optical signals from one or more remote sources. The photodiode generates a dc current having a magnitude substantially proportional to the intensity of the received light. This current is conducted on line to 17 to a preamplifier 19, for amplification by a factor of about 40,000. The preamplifier preferably is a transimpedance amplifier that produces an output signal that varies between about 1.5 volts, for a low- or quiescent-level input signal, and 2.3 volts, for a high-level signal. The noise level of the preamplifier, which is determined by various conventional factors, is limited to about 2 picoamps/$\sqrt{Hz}$ in sunlight and about 0.9 picoamps/$\sqrt{Hz}$ in average room illumination.

The output signal from the preamplifier is supplied on line 21 from the preamplifier 19 to a tuned amplifier 23, for further amplification by a factor of about 40. The tuned amplifier has a center frequency of about 1.5 MHz, which is the nominal pulse frequency of the received optical signals, and it has a bandwidth of about 250 KHz, which is the approximate bandwidth of the 75 kilobit per second data signal. The tuned amplifier preferably incorporates three single-tuned resonant circuits, each having a Q of about 3.3, and these circuits are single tuned and synchronous tuned. Consequently, the envelope of the tuned amplifier's output signal is substantially free of any overshoot or undershoot.

The tuned amplifier 23 preferably has a time constant that is sufficiently low for the amplifier to fully recover from the receipt of a signal of relatively high intensity in substantially less time than the demodulator's desired 100-microsecond latency period. In this case, the tuned amplifier has a time constant of about 1 microsecond, which means that its output will decay by a factor of 5000 in about 9 microseconds.

The amplified signal output by the tuned amplifier 23 is supplied on line 25 to an edge detector 27, which incorporates a full-wave rectifier and a low-pass filter. The edge detector outputs a signal that generally follows the envelope of the amplified signal, but with a small amount of ripple due to the optical signal's pulsed format. The edge detector thus functions basically as a peak detector of the amplified signal's envelope.

The envelope signal output by the edge detector 27 is supplied on line 29 to a comparator 31, for comparison with a prescribed threshold supplied on line 33. This produces an output signal that is generally in a HIGH state when a light pulse is being received and in a LOW state otherwise. However, inherent time delays in the circuitry of the edge detector will delay both the leading edge and the trailing edge of the each such output pulse. The leading edge is delayed by a greater amount than is the trailing edge. Consequently, the duration of each such output pulse is shorter than the duration of the light pulse on which it is based.

The shortened duration of each output pulse of the comparator 31 is increased back to a duration corresponding to the nominal duration of a burst of light pulses by a pulse stretcher circuit 35. That circuit receives the output pulse signal on line 37 from the comparator 31, and it functions like a mono-stable multivibrator circuit, or one-shot, such that it produces a succession of pulses having a nominal duration of about 6.67 microseconds. This output pulse sequence is supplied on line 39 to a buffer circuit 41, to produce the demodulator's output signal on line 13.

The amount of time by which the leading edge of the envelope signal is delayed will vary according to the strength of the received signal. Strong signals will result in shorter delays. This variability is compensated for by the pulse stretcher circuit 35, which essentially stretches the durations of all of the envelope signals to the same nominal value.

Figure 2:
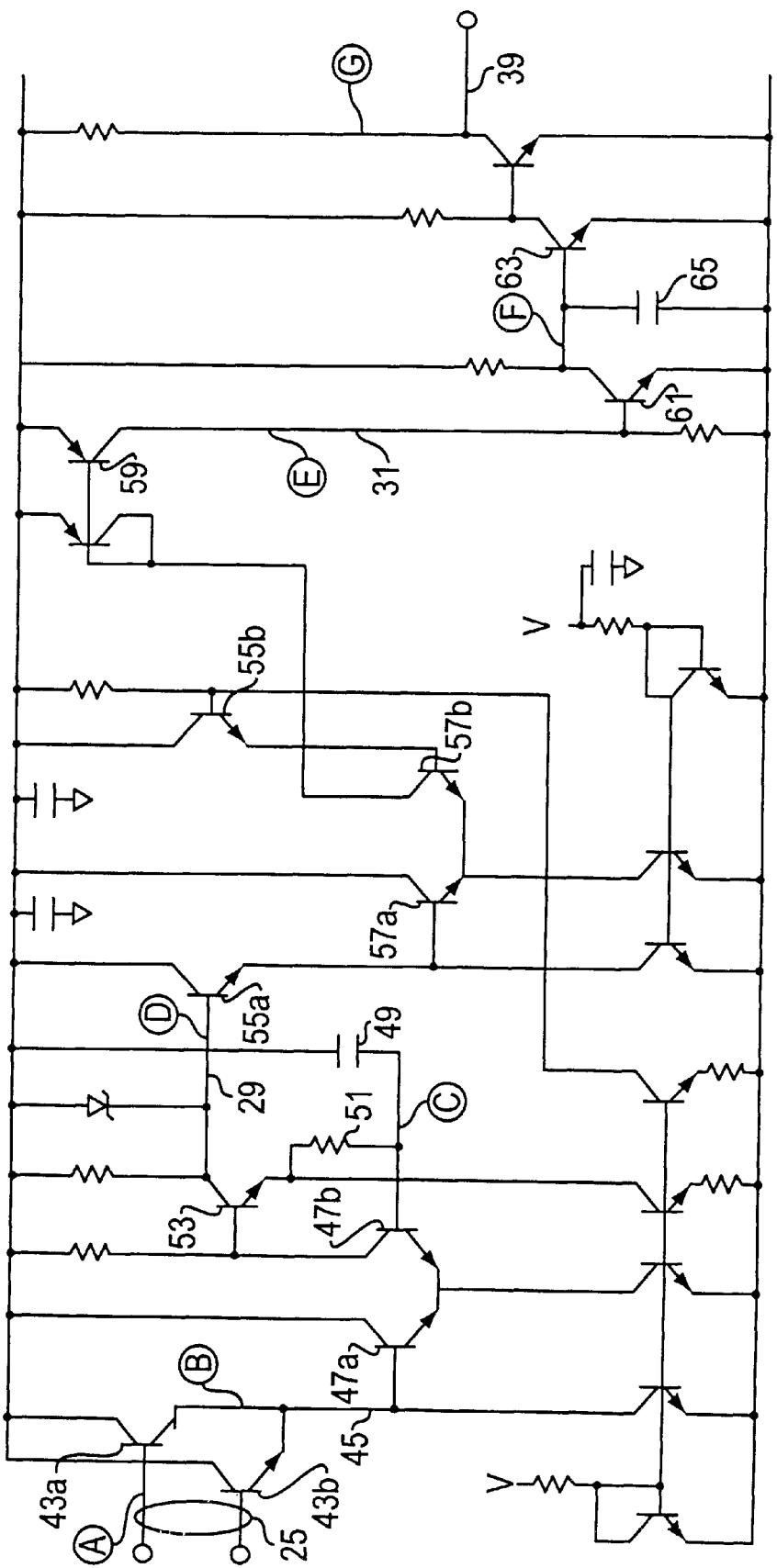
FIG. 2 is a schematic circuit diagram of the edge detector, comparator, and pulse stretcher of the demodulator of FIG. 1.

FIG. 2 depicts one suitable circuit implementation for the edge detector 27, comparator 31, and pulse stretcher circuit 35. This circuitry is described below, with reference to the exemplary signal waveforms depicted in FIGS. 3(a)–3(g).

Figure 3A:
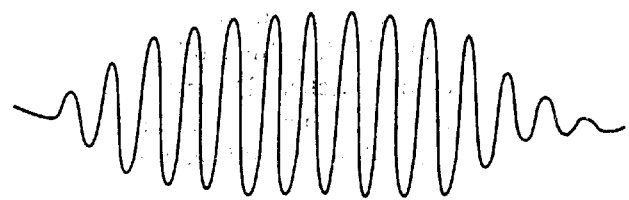
FIGS. 3(a)–3(g) depict several representative waveforms present at specified locations within the circuit depicted in FIG. 2.
Figure 3B:
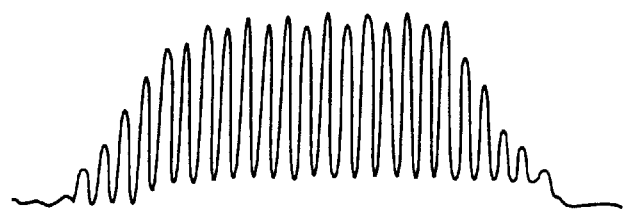

The output stage of the tuned amplifier 23 has the form of a push-pull circuit, and it produces an amplified signal that is supplied to the circuitry of FIG. 2 via lines 25. The signal is initially rectified by transistors 43a and 43b. Representative examples of the amplified signal and the resulting rectified signal are depicted in FIGS. 3(a) and 3(b), respectively. The locations of these two signals in the circuitry of FIG. 2 are depicted by the reference letters A and B, respectively. These signals result from the receipt by the demodulator 11 of a 6.67-microsecond burst of optical pulses in an ASK optical signal of relatively high intensity. The burst incorporates ten individual optical pulses, each of duration 0.333 microseconds. It will be noted that the amplified signal on lines 25 has an amplitude of about 150 millivolts, peak-to-peak, and that the rectified signal has a frequency that is double that of the non-rectified signal.

Figure 3C:
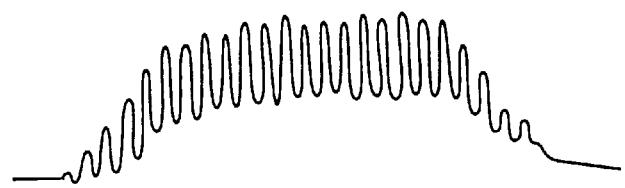
Figure 3D:
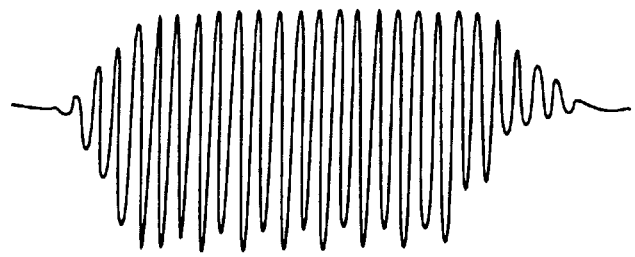

The rectified signal (FIG. 3(b)) is supplied via line 45 to the base terminal of a transistor 47a, which is configured with a transistor 47b as a differential amplifier. The base terminal of the transistor 47b is connected through a capacitor 49 to a voltage reference and also through a resistor 51 to the emitter terminal of a transistor 53. The collector terminal of the transistor 53 provides the edge detector's output signal on line 29. Examples of the signal present at the base terminal of the transistor 47b and the edge detector's output signal are depicted in FIGS. 3(c) and 3(d), respectively. The locations of these two signals in the circuitry of FIG. 2 are identified by the reference letters C and D, respectively.

It will be noted that positive excursions of the rectified signal (FIG. 3(b)) cause the capacitor 49 to be charged positively, with current being limited by the resistor 51 to a maximum of about 100 microamps. Negative excursions of the rectified signal, on the other hand, cause the capacitor to be discharged negatively, with current being limited to a maximum of about 300 microamps. Thus, the capacitor's charging time is about one-third its discharge time, as can be observed in FIG. 3(c). This causes the edge detector's output signal, or envelope signal (FIG. 3(d)), to be symmetrical, with a relatively fast attack and with a fast decay, with little latency. This envelope signal is present at the location identified by the reference letter D in FIG. 2.

The comparator 31 compares the envelope signal (FIG. 3(d)) with a prescribed threshold, selected to be about –0.133 volts. This is accomplished using the transistors 55a, 55b, 57a, and 57b and 59. When the envelope signal is more negative than the threshold, the comparator biases the transistor 59 ON, which causes the resulting comparator output signal to be in a HIGH state. This output signal is depicted in FIG. 3(e), and it is present at the location identified by the reference letter E in FIG. 2.

Figure 3E:
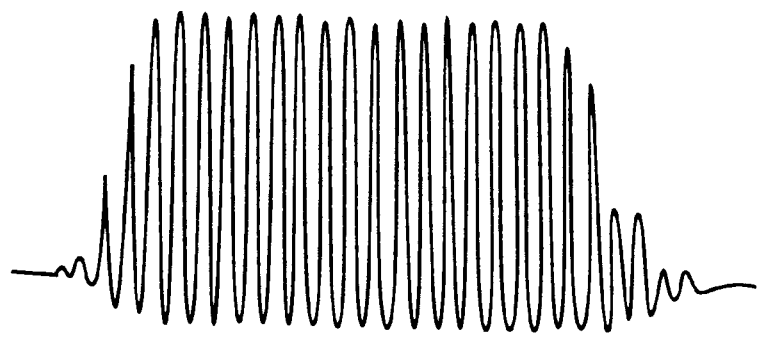
Figure 3F:
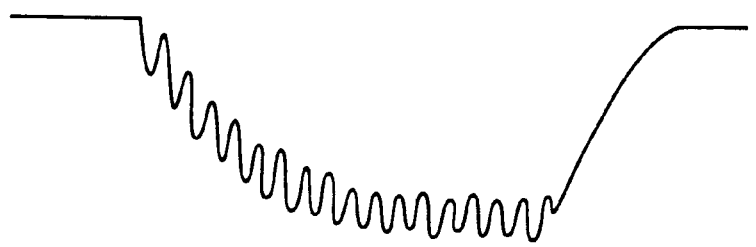
Figure 3G:
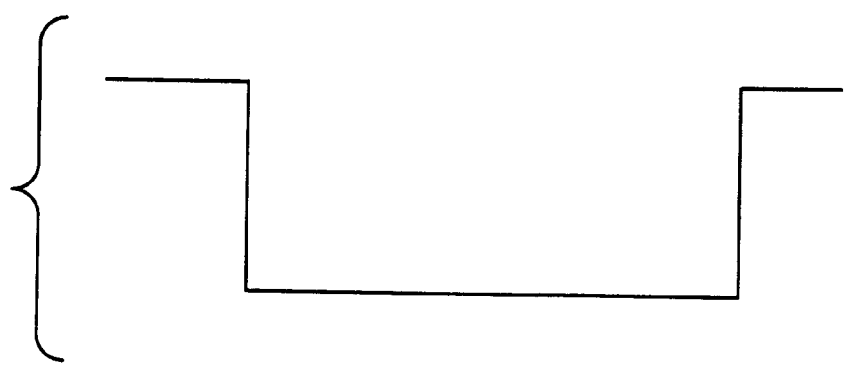

With reference to FIGS. 3(d) and 3(e), it will be noted that the envelope signal first exceeds the threshold about 1.8 microseconds after the start of the burst and that it then remains above the threshold for 17 half cycles of the burst, or until about 7 microseconds after the start of the burst. The pulses of the comparator output signal thus have a combined duration of only about 5.2 microseconds, although the pulses of the envelope signal have a combined duration of about 6.67 microseconds. The pulse stretcher 35 lengthens the duration of the signal output by the comparator 31 (see FIG. 3(e)), and it produces a single output pulse having a duration more closely matched to that of the original burst. With reference to FIG. 2, the pulse stretcher includes transistors 61 and 63 and an intervening capacitor 65. The transistor 61 receives the comparator output signal via line 31 and, when biased ON, discharges the capacitor 65. This transistor is not biased ON until about the third cycle of the 20-cycle burst, i.e., until about 1.8 microseconds have elapsed. The capacitor eventually is discharge d to about 0.3 volts, which biases the transistor 63 OFF and thus causes the pulse stretcher's output signal to go LOW. The voltage on the capacitor is present at the location in FIG. 2 identified by the reference letter F, and it is shown in FIG. 3(f). The pulse stretcher's output signal is present at the location in FIG. 2 identified by the reference letter G, and it is shown in FIG. 3(g).

When the output signal from the comparator 31 again biases the transistor 61 OFF, the capacitor 65 begins charging, eventually reaching a voltage sufficient to bias the transistor 63 ON. This occurs about 8.5 microseconds after the start of the burst. This has the effect of stretching the duration of the comparator output signal. The transistor 63 thus is biased ON for a duration of about 6.67 microseconds, which corresponds to the nominal duration of the original burst. The pulse of the pulse stretcher's output signal (FIG. 3(g)) has a similar stretched duration. As stated above, this output signal is supplied to the output buffer 41 (FIG. 1), to interface properly with the load.

It will be appreciated that double pulsing might sometimes occur at the beginning of each pulse burst when using the circuitry depicted in FIG. 2. This double pulsing can be eliminated by configuring the comparator 31 to incorporate an appropriate amount of hysteresis.

It should be appreciated from the foregoing description that the present invention provides an improved demodulator for digital ASK data signals whose data bits are each characterized by either an absence of pulses or a burst of pulses at a predetermined frequency. The demodulator includes an amplifier tuned to this predetermined frequency, and it further includes an edge detector that produces an envelope of the amplified signal. A comparator then compares the envelope signal with a prescribed threshold, to produce a pulse signal for each received burst of pulses. The duration of this pulse signal is then stretched so as to correspond to the pulse burst's expected nominal duration. The demodulator is specially configured such that it can properly demodulate ASK data signals having power levels that vary over a range of several orders of magnitude.

Although the invention has been described in detail with reference only to the presently preferred embodiment, those skilled in the art will appreciate that various modifications can be made without departing from the invention. Accordingly, the invention is defined only by the following claims.

I claim:

1. An apparatus for demodulating a digital amplitude-shift keyed (ASK) data signal, in which data bits are each characterized by either an absence of pulses or a burst of pulses at a predetermined frequency, wherein the signal strength of the data signal can vary by several orders of magnitude, the apparatus comprising:

a bandpass amplifier that receives and amplifies the ASK data signal, to produce an amplified signal, wherein the amplifier is tuned to the predetermined frequency of the bursts of pulses of the ASK data signal;

an edge detector that detects the envelope of the amplified signal received from the bandpass amplifier, to produce an envelope signal;

a comparator that compares the envelope signal with a prescribed threshold, to produce a pulse signal indicative of the presence of a burst of pulses in the ASK data signal; and a pulse stretcher that increases the length of each pulse in the pulse signal to a length substantially the same as that of the corresponding burst of pulses in the ASK data signal.

2. An apparatus as defined in claim 1, wherein the duration of the pulse signal produced by the comparator varies according to the strength of the ASK data signal received by the apparatus.

3. An apparatus as defined in claim 1, wherein the pulse stretcher is a mono-stable multivibrator.

4. An apparatus as defined in claim 1, wherein:

the ASK data signal is an optical signal; and the apparatus further comprises a device for receiving the optical ASK data signal and converting the data signal to a corresponding electrical signal.

5. An apparatus as defined in claim 1, wherein the bandpass amplifier has a substantially constant gain.

6. A method for demodulating a digital amplitude-shift keyed (ASK) data signal, in which data bits are each characterized by either an absence of pulses or a burst of pulses at a predetermined frequency, wherein the signal strength of the data signal can vary by several orders of magnitude, the method comprising:

amplifying the ASK data signal using a bandpass amplifier tuned to the predetermined frequency of the bursts of pulses of the ASK data signal, to produce an amplified signal;

detecting the envelope of the amplified signal, to produce an envelope signal;

comparing the envelope signal with a prescribed threshold, to produce a pulse signal indicative of the presence of a burst of pulses in the ASK data signal; and increasing the length of each pulse in the pulse signal to a length substantially the same as that of the corresponding burst of pulses in the ASK data signal.

7. An apparatus for demodulating a digital amplitude-shift keyed (ASK) data signal, in which data bits are each characterized by either an absence of pulses or a burst of pulses at a predetermined frequency, wherein the signal strength of the data signal can vary by several orders of magnitude, the apparatus comprising:

means for receiving and amplifying the ASK data signal, to produce an amplified signal, wherein the means for amplifying is tuned to the predetermined frequency of the bursts of pulses of the ASK data signal;

an edge detector means for detecting the envelope of the amplified signal received from the bandpass amplifier, to produce an envelope signal;

a comparator means for comparing the envelope signal with a prescribed threshold, to produce a pulse signal indicative of the presence of a burst of pulses in the ASK data signal; and a pulse stretcher means for increasing the length of each pulse in the pulse signal to a length substantially the same as that of the corresponding burst of pulses in the ASK data signal.

8. An apparatus as defined in claim 7, wherein the duration of the pulse signal produced by the comparator means varies according to the strength of the ASK data signal received by the apparatus.

9. An apparatus as defined in claim 7, wherein the pulse stretcher means is a mono-stable multivibrator.

10. An apparatus as defined in claim 7, wherein:

the ASK data signal is an optical signal; and the apparatus further comprises a means for receiving the optical ASK data signal and converting the data signal to a corresponding electrical signal.

11. An apparatus as defined in claim 7, wherein the means for amplifying has a substantially constant gain.

* * * * *